United States Patent
Hsu et al.

(10) Patent No.: US 9,437,577 B2
(45) Date of Patent: Sep. 6, 2016

(54) PACKAGE ON PACKAGE STRUCTURE WITH PILLAR BUMP PINS AND RELATED METHOD THEREOF

(71) Applicant: MEDIATEK INC., Hsin-Chu (TW)

(72) Inventors: Wen-Sung Hsu, Hsinchu County (TW); Shih-Chin Lin, Taoyuan County (TW)

(73) Assignee: MEDIATEK INC., Hsin-Chu (TW)

(*) Notice: Subject to any disclaimer, the term of this patent is extended or adjusted under 35 U.S.C. 154(b) by 0 days.

(21) Appl. No.: 14/273,553

(22) Filed: May 9, 2014

(65) Prior Publication Data

US 2015/0325549 A1   Nov. 12, 2015

(51) Int. Cl.
| | | |
|---|---|---|
| *H01L 23/48* | (2006.01) | |
| *H01L 25/065* | (2006.01) | |
| *H01L 23/00* | (2006.01) | |
| *H01L 23/495* | (2006.01) | |
| *H01L 25/00* | (2006.01) | |
| *H01L 23/498* | (2006.01) | |
| *H01L 25/10* | (2006.01) | |

(52) U.S. Cl.
CPC ..... *H01L 25/0657* (2013.01); *H01L 23/49575* (2013.01); *H01L 23/49811* (2013.01); *H01L 24/17* (2013.01); *H01L 24/81* (2013.01); *H01L 25/105* (2013.01); *H01L 25/50* (2013.01); *H01L 2224/13147* (2013.01); *H01L 2224/16113* (2013.01); *H01L 2224/16145* (2013.01); *H01L 2224/16245* (2013.01); *H01L 2224/81801* (2013.01); *H01L 2225/06513* (2013.01); *H01L 2225/06517* (2013.01); *H01L 2225/1029* (2013.01); *H01L 2225/1058* (2013.01); *H01L 2924/1434* (2013.01); *H01L 2924/1533* (2013.01); *H01L 2924/15311* (2013.01)

(58) Field of Classification Search
CPC ............... H01L 25/0657; H01L 25/50; H01L 21/76885; H01L 23/49575; H01L 24/12; H01L 24/17; H01L 24/81; H01L 2224/1134
USPC .......................................... 257/737, 777, 780
See application file for complete search history.

(56) References Cited

U.S. PATENT DOCUMENTS

| | | | | |
|---|---|---|---|---|
| 5,067,007 | A * | 11/1991 | Otsuka ................. | H05K 3/3426 257/692 |
| 7,177,142 | B2 * | 2/2007 | Kabadi ................. | H05K 3/308 257/779 |
| 2009/0206461 | A1 * | 8/2009 | Yoon ..................... | H01L 21/565 257/686 |
| 2009/0236733 | A1 * | 9/2009 | Chow et al. .................. | 257/713 |
| 2010/0133665 | A1 | 6/2010 | Ha | |
| 2011/0074026 | A1 * | 3/2011 | Shim ................... | H01L 21/4846 257/737 |
| 2011/0115081 | A1 | 5/2011 | Osumi | |
| 2012/0001306 | A1 | 1/2012 | Wang | |
| 2012/0015481 | A1 | 1/2012 | Kim | |
| 2014/0035892 | A1 * | 2/2014 | Shenoy ................ | G09G 3/3266 345/205 |
| 2014/0062587 | A1 * | 3/2014 | Koyanagi ..................... | 327/595 |
| 2014/0124947 | A1 * | 5/2014 | Chuang et al. ................ | 257/774 |
| 2015/0021760 | A1 * | 1/2015 | Lin ......................... | H01L 24/81 257/737 |

(Continued)

*Primary Examiner* — Tu-Tu Ho
(74) *Attorney, Agent, or Firm* — Winston Hsu; Scott Margo

(57) ABSTRACT

A package on package (POP) structure includes at least a first package and a second package. The first package has a plurality of pillar bump pins. The second package has a plurality of pads connected to the pillar bump pins, respectively. A method of forming a package on package (POP) structure includes at least the following steps: providing a first package with a plurality of pillar bump pins; providing a second package with a plurality of pads; and forming the POP structure by connecting the pillar bump pins to the pads.

10 Claims, 2 Drawing Sheets

(56) References Cited

U.S. PATENT DOCUMENTS

2015/0091178 A1* 4/2015 Reber .................. H01L 23/481 257/774

2015/0097285 A1* 4/2015 Chylak .................. H01L 24/17 257/737

* cited by examiner

PACKAGE ON PACKAGE STRUCTURE WITH PILLAR BUMP PINS AND RELATED METHOD THEREOF

BACKGROUND

The disclosed embodiments of the present invention relate to a package on package (POP) structure, and more particularly, to a POP structure including at least a first package and a second package connected to each other via a plurality of pillar bump pins, and related method thereof.

Package on package (POP) is a widely applied integrated circuit packaging method for combining vertically discrete logic and memory ball grid array (BGA) packages, wherein two or more packages are installed atop each other, i.e. stacked, with a standard interface to route signals between them. This allows higher component density in devices, such as mobile phones, personal digital assistants (PDA), and digital cameras.

Configurations for POP such as pure memory stacking and mixed logic-memory stacking are commonly applied in systems having size requirements, e.g. a mobile phone. However, the conventional BGA employed for combining packages to form the POP stacking structure has its restrictions with pitch width. In other words, the pitch width of BGA is hard to be reduced and may lead to inadequate pin count between the stacked packages, which contradicts the trend of growing density of memory and logic dies.

SUMMARY

Therefore, one of the objectives of the present invention is to provide a POP structure including at least a first package and a second package connected to each other via a plurality of pillar bump pins and a related method thereof, to solve the aforementioned problems.

According to one aspect of the present invention, an exemplary package on package (POP) structure is disclosed. The POP structure includes a first package and a second package. The first package has a plurality of pillar bump pins. The second package has a plurality of pads connected to the pillar bump pins, respectively.

According to another aspect of the present invention, an exemplary method of forming a package on package (POP) structure is disclosed. The method includes: providing a first package with a plurality of pillar bump pins; providing a second package with a plurality of pads; and forming the POP structure by connecting the pillar bump pins to the pads.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
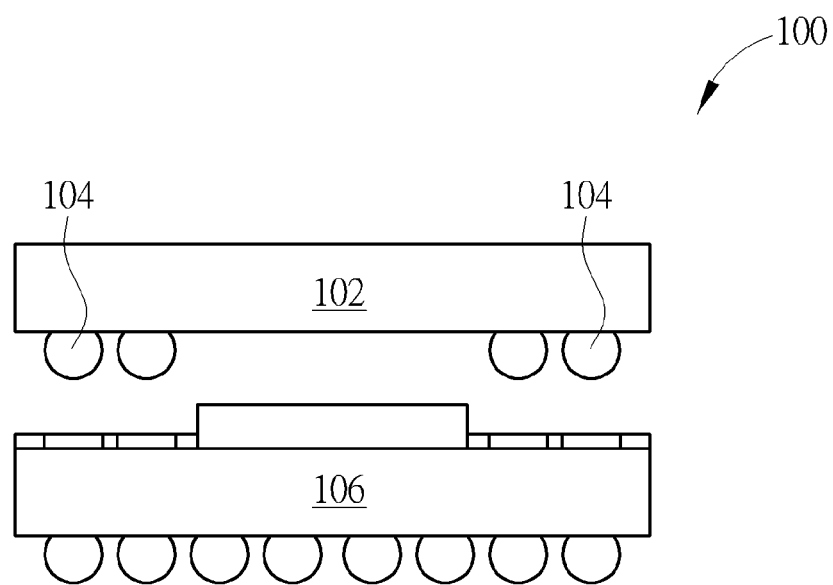
FIG. 1 is a diagram illustrating a conventional package on package (POP) structure with ball grid array (BGA) pins.

Please refer to FIG. 1, which is a diagram illustrating a conventional package on package (POP) structure 100 with ball grid array (BGA) pins 104. The POP 100 includes a first package 102 and a second package 106 connected to each other via the BGA pins 104. Table 1 indicates specifications of the POP 100 with different package sizes.

TABLE 1

| Package size | Top package pitch | Row | Allowable pin count |
| --- | --- | --- | --- |
| 12 mm * 12 mm | 0.5 mm | 2 | 168 |
|  | 0.4 mm | 2 | 216 |
| 14 mm * 14 mm | 0.5 mm | 2 | 200 |
|  | 0.4 mm | 2 | 240 |

It is obvious that the allowable pin count increases as the package pitch shrinks; however, the minimum package pitch between rows of the BGA pins is 0.4 mm pursuant to its physical and electrical characteristics. Therefore, the maximum allowable BGA pin count is restricted to 216 and 240 for 12 mm*12 mm and 14 mm*14 mm POP structures, respectively.

Figure 2:
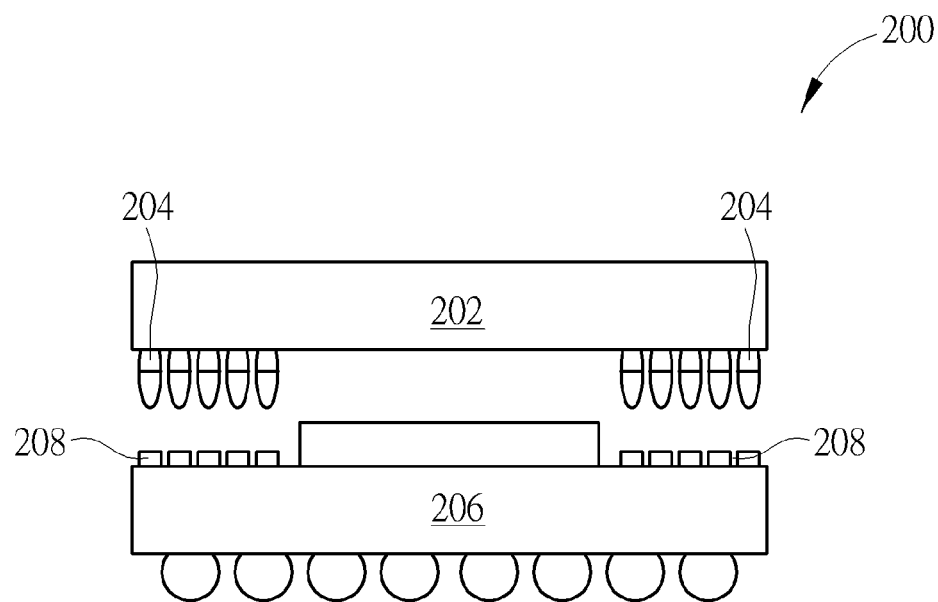
FIG. 2 is a diagram illustrating a package on package (POP) structure with pillar bump pins according to a first embodiment of the present invention.
Figure 3:
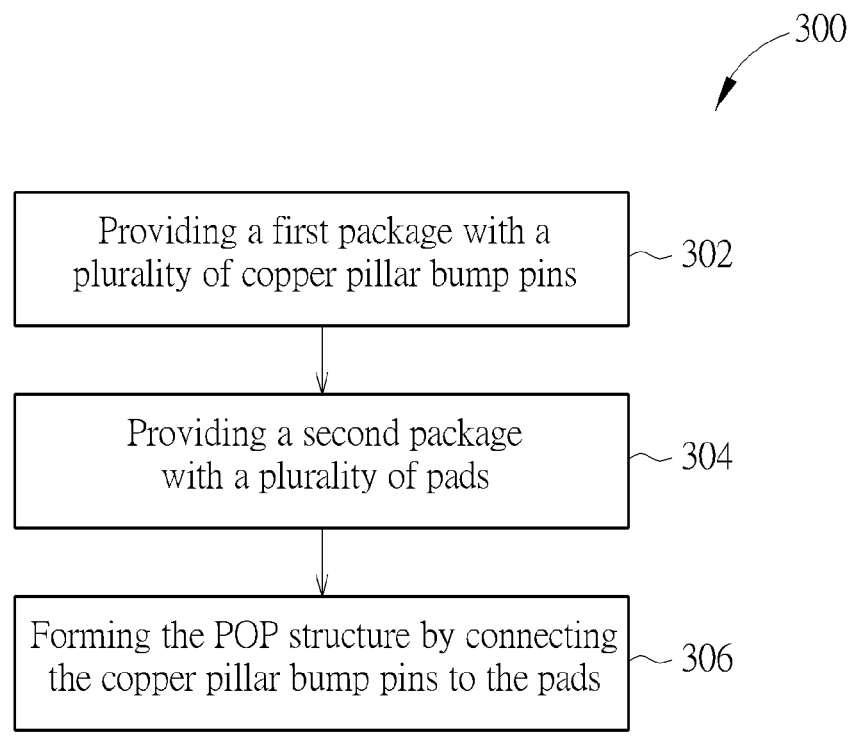
FIG. 3 is a flowchart illustrating a method of forming a package on package (POP) structure according to a second embodiment of the present invention.

Please refer to FIG. 2 in conjunction with FIG. 3. FIG. 2 is a diagram illustrating a package on package (POP) structure 200 with pillar bump pins (e.g., copper pillar bump pins 204) according to a first embodiment of the present invention. FIG. 3 is a flowchart illustrating a method of forming a package on package (POP) structure according to a second embodiment of the present invention. Provided that substantially the same result is achieved, the steps of the flowchart shown in FIG. 3 need not be in the exact order shown and need not be contiguous; that is, other steps can be intermediate. Some steps in FIG. 3 may be omitted according to various types of embodiments or requirements. The method may be briefly summarized as follows:

Step 302: Provide a first package with a plurality of copper pillar bump pins;

Step 304: Provide a second package with a plurality of pads; and

Step 306: Form the POP structure by connecting the pillar bump pins to the pads.

The POP 200 includes a first package 202 with a plurality of pillar bump pins (e.g., copper pillar bump pins 204) and a second package 206 with a plurality of pads 208, and the first package 202 and the second package 206 further connect to each other by sticking the copper pillar bump pins 204 to the pads 208 via solder. By way of example, the first package 202 may have a memory die inside, and the second package 206 may have a logic die or another memory die inside. Table 2 indicates specifications of the POP 200 with different package sizes.

TABLE 2

| Package size | Top package pitch | \multicolumn{5}{c}{Row/Allowable pin count} |
|---|---|---|---|---|---|---|
| | | 2 | 3 | 4 | 5 | 6 |
| 12 mm * 12 mm | 0.5 mm | 168 | 240 | | | |
| | 0.4 mm | 216 | 312 | | | |
| | 0.3 mm | 288 | 420 | 544 | | |
| | 0.2 mm | 440 | 648 | 848 | 1041 | |
| 14 mm * 14 mm | 0.5 mm | 200 | 288 | | | |
| | 0.4 mm | 240 | 372 | | | |
| | 0.3 mm | 344 | 504 | 656 | 800 | |
| | 0.2 mm | 520 | 768 | 1008 | 1240 | 1464 |

Since package pitch between rows of the copper pillar bump pins 204 is able to be shrunk to 0.2 mm pursuant to its physical and electrical characteristics, the maximum allowable pin count now extends to 1041 and 1464 for 12 mm*12 mm and 14 mm*14 mm POP structures, respectively.

Figure 4:
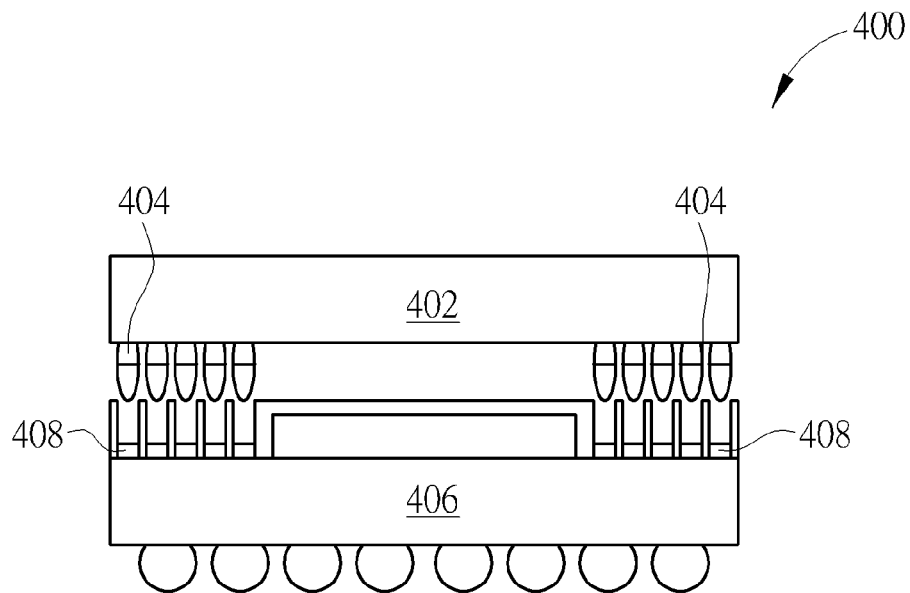
FIG. 4 is a diagram illustrating a package on package (POP) structure with pillar bump pins according to a third embodiment of the present invention.

It should be noted that the disclosed embodiments set forth are for illustrative purpose only, and are not meant to be limitations of the present invention. For instance, please refer to FIG. 4, which is a diagram illustrating a package on package (POP) structure 400 with pillar bump pins (e.g., copper pillar bump pins 404) according to a third embodiment of the present invention. The POP 400 includes a first package 402 with a plurality of pillar bump pins (e.g., copper pillar bump pins 404) and a second package 406 with a plurality of pads 408, and the first package 402 and the second package 406 further connect to each other by sticking the copper pillar bump pins 404 to the pads 408 via solder. By way of example, the first package 402 may have a memory die inside, and the second package 406 may have a logic die or another memory die inside. The difference between the second package 406 shown in FIG. 4 and the second package 206 shown in FIG. 2 is that the pad 408 of the second package 406 has leadframes while the pad 208 of the second package 206 does not have leadframes; in other words, the POP 400 is a leadframe package, and the POP 200 is a no-lead package. Those alternative designs concerned also belong to the scope of the present invention.

In above embodiment, the pillar part of the pillar bump pin may be preferably made of copper. However, this is for illustrative purposes only. In an alternative design, the pillar part of the pillar bump pin may be made of a different conductive material. To put it short, any POP structure using pillar bump pins to connect one package to another package for increasing the maximum allowable pin count falls within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A package on package (POP) structure, comprising:
   a first package, having a plurality of pillar bump pins; and
   a second package, having a plurality of pads connected to the pillar bump pins, respectively, having at least one die inside, wherein a middle part of one of the pillar bump pins is pillar and a top part of the pillar bump pin is an elongated bump, and the top part of the one of the pillar bump pins is formed before the first package is connected to the second package; and the plurality of pillar bump pins are not overlaid with the at least one die of the second package.

2. The POP structure of claim 1, wherein the pillar bump pins are copper pillar bump pins.

3. The POP structure of claim 1, wherein the first package is for a memory die.

4. The POP structure of claim 1, wherein the second package is a no-lead package.

5. The POP structure of claim 1, wherein the second package is a leadframe package.

6. A method of forming a package on package (POP) structure, comprising:
   providing a first package with a plurality of pillar bump pins, wherein a middle part of one of the pillar bump pins is pillar and a top part of the pillar bump pin is an elongated bump;
   providing a second package with a plurality of pads, wherein the second package has at least one die inside; and
   forming the POP structure by connecting the pillar bump pins to the pads;
   wherein the top part of the one of the pillar bump pins is formed before the first package is connected to the second package; and the plurality of pillar bump pins are not overlaid with the at least one die of the second package.

7. The method of claim 6, wherein the pillar bump pins are copper pillar bump pins.

8. The method of claim 6, wherein the first package is for a memory die.

9. The method of claim 6, wherein the second package is a no-lead package.

10. The method of claim 6, wherein the second package is a leadframe package.

* * * * *